(12) United States Patent
Heppe

(10) Patent No.: US 7,185,261 B2
(45) Date of Patent: Feb. 27, 2007

(54) MULTIDIMENSIONAL TURBO PRODUCT CODE DECODING OF ENCODED DATA TRANSMITTED OVER DIVERSITY CHANNEL

(75) Inventor: Stephen Heppe, Hood River, OR (US)

(73) Assignee: The Insitu Group, Inc., Bingen, WA (US)

( * ) Notice: Subject to any disclaimer, the term of this patent is extended or adjusted under 35 U.S.C. 154(b) by 482 days.

(21) Appl. No.: 10/833,888

(22) Filed: Apr. 28, 2004

(65) Prior Publication Data
US 2004/0261007 A1 Dec. 23, 2004

Related U.S. Application Data

(60) Provisional application No. 60/466,293, filed on Apr. 28, 2003.

(51) Int. Cl.
*H04L 1/02* (2006.01)
*H03M 13/45* (2006.01)
*H03M 13/29* (2006.01)

(52) U.S. Cl. ............... 714/755; 714/777; 714/780; 714/819; 714/820; 714/821; 714/822

(58) Field of Classification Search .............. 714/755, 714/777, 780; *H03M 13/45*
See application file for complete search history.

(56) References Cited

U.S. PATENT DOCUMENTS

2002/0083391 A1* 6/2002 Huggett et al. ............. 714/777
2003/0058890 A1* 3/2003 Ritchie et al. .............. 370/486
2004/0190636 A1* 9/2004 Oprea ........................ 375/260

FOREIGN PATENT DOCUMENTS

JP          61270935 A   * 12/1986
JP          62146033 A   *  6/1987

OTHER PUBLICATIONS

Elias, P.; Error-free Coding; Information Theory, IEEE Transactions on; vol. 4, Issue 4, Sep. 1954; pp. 29-37.*
Shi et al.; Turbo product codes on frequency selective fading channel: Vehicular Technology Conference, 2002. VTC Spring 2002. IEEE 55th; Publication Date: May 6-9, 2002; vol. 3; On pp. 1233-1236.*

(Continued)

*Primary Examiner*—R. Stephen Dildine
(74) *Attorney, Agent, or Firm*—Perkins Coie LLP

(57) ABSTRACT

A system and method to transmit and receive forward error corrected data in a diversity communications system is provided. Using diversity techniques, multiple copies of the transmitted data are received with varying degrees of corruption due to channel impairments. In addition to the multiple copies of forward error corrected data, an additional data set of implicit parity bits is used in the data decoding process, wherein the reliability of these parity bits is assumed to be very high. The implicit parity bits are not transmitted or received by the system, but are introduced in the receivers' decoding process. These implicit parity bits add an extra highly reliable dimension of forward error correction codes. Therefore the present system and methods provide an improved data decoding process with high coding gain and channel efficiency, while minimizing system resources.

20 Claims, 3 Drawing Sheets

OTHER PUBLICATIONS

Cavalec-Amis et al.; Block turbo codes for space-time systems; Global Telecommunications Conference, 2000. GLOBECOM '00. IEEE; Publication Date: Nov. 27-Dec. 1, 2000; vol. 2; On pp. 1021-1025.*

Gallagher, Robert G., "Low-Density Parity-Check Codes," published 1963 by the M.I.T. Press, Cambridge, Massachusetts. Book consists of 102 pages.

Lin, Shu and Costello, Daniel J. (Jr.), "Error Control Coding Fundamentals and Applications," Prentice-Hall, Inc., Englewood Cliffs, NJ, 1983, ISBN 0-13-283796-X, pp. 274-277.

Williams, David, "Turbo Product Code Tutorial," May 1, 2000, Advanced Hardware Architectures, Inc., Pullman, WA. IEEE 802.16 Presentation Submission Template (Rev. 8), Document No. IEEE 802.16t-00/01, 64 pages.

* cited by examiner

MULTIDIMENSIONAL TURBO PRODUCT CODE DECODING OF ENCODED DATA TRANSMITTED OVER DIVERSITY CHANNEL

CROSS-REFERENCE TO RELATED APPLICATION

The present application claims the benefit of U.S. Provisional Application No. 60/466,293, filed Apr. 28, 2003, now abandoned, which is incorporated herein in its entirety by reference.

TECHNICAL FIELD

The present invention is directed to the enhancement of data communications using forward error correction techniques in a diversity transmission system.

BACKGROUND

Error detection and error correction are commonly used to provide reliable data communications. A technique called forward error correction (FEC) features the addition to the data stream of information that is decoded upon reception. Numerous FEC coding techniques exist and are in wide use today. Some methods include block or algebraic codes and convolutional codes. Gallager introduced a class of codes known as Low Density Parity Check (LDPC) codes, which can be applied to bits or sets of bits (packets), and Elias introduced product codes in 1954. Tanner in 1981 and Lin and Costello in 1983 described the concept of a "turbo product code" (TPC), the iterative decoding of product codes. In turbo product decoding, the reliability information and the tentative bit decisions are updated in an iterative fashion ultimately leading to an improved decoding capability.

FEC techniques may be differentiated in terms of their "power" (ability to correct errors) and their "rate" (defined as the number of information bits encoded divided by the total number of bits transmitted). A high rate, close to one, implies very little supplementary information or "overhead." Conversely, a low rate implies that the FEC code introduces many bits of supplementary information for every bit of user information. A high-rate code with high power is desirable, since such a code can correct many errors while consuming a relatively small fraction of the communications resource.

A communications channel may comprise either a single path between a transmitter and receiver or multiple paths (a diversity system). The multiple paths can be created by a single transmitter sending data to multiple receiving antennas and receivers, or by a single transmitter sending the same data multiple times. Other diversity techniques exist (e.g., frequency, code, angle, polarization). Each diversity path is subject to noise and other forms of degradation, so all copies of a message received by a receiving system may be corrupted in some way. However, typically the noise statistics and other forms of signal degradation are un-correlated to a certain degree across the various diversity paths, so that a single bit or message may be corrupted on one path, but uncorrupted (or relatively uncorrupted) on another path.

The receiving equipment typically selects one of the outputs of the diversity communications channel, or combines the multiple copies in some fashion, as a prelude to further processing and decoding. A significant body of work exists with regard to optimum diversity combining techniques. Some of the complexities of the decoding process are due to the fact that none of the received data can be assumed to be 100% correct. This process of combining and correcting multiple copies of received data in an iterative manner is also resource intensive and time consuming. Therefore, although diversity transmission and reception using FEC coding is somewhat successful, a simple, reliable and more efficient method of decoding is still sought.

DETAILED DESCRIPTION

A system and method to transmit and receive forward error corrected data in a diversity communications system is provided. The transmitted data contains user information and redundant information (parity bits) comprising a forward error correction code such as a turbo product code. Using diversity techniques, multiple copies of the transmitted data are received with varying degrees of corruption to the data. In addition to the received data, an additional data set of implicit parity bits is used in the data decoding process, wherein the reliability of these parity bits is assumed to be very high. The implicit parity bits are not transmitted or received by the system, but are introduced in the receivers' decoding process. These implicit parity bits add an extra highly reliable dimension of forward error correction codes. Therefore, the present system and methods provide an improved data decoding process with high coding gain and channel efficiency.

Figure 1:
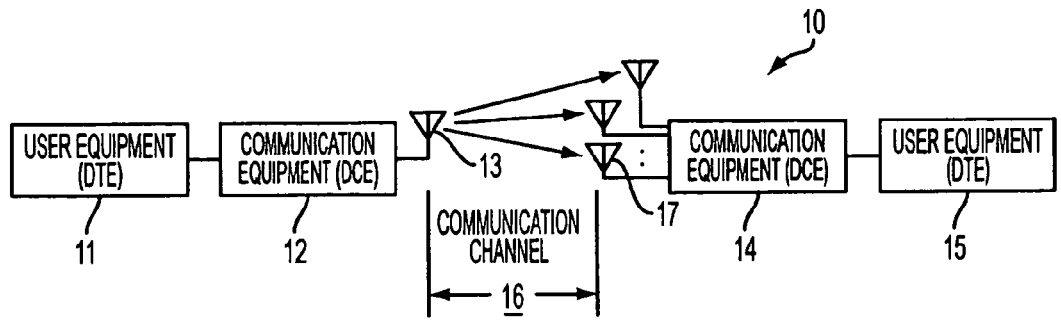
FIG. 1 illustrates a diversity communication system comprising data terminal equipment (DTE), data communications equipment (DCE), and a communications channel with multiple paths.

FIG. 1 illustrates the communications system 10 of an embodiment comprising data terminal equipment (DTE's) 11 and 15, data communications equipment (DCE's) 12 and 14, and a communications channel 16 with multiple paths. DTE's 11 and 15 may, for example, be computers or other equipment enabled to exchange information in one or both directions. DCE's 12 and 14 are communications devices that support the DTE's 11 and 15 by passing information over a communications channel with multiple paths (sometimes described as multiple communications channels). In this figure, the DCE's 12 and 14 are radios that access the communications channel 16 via a transmitting antenna 13 and multiple receiving antennas 17. Other examples of communication channels include telephone channels, data networks, and data storage devices such as hard disks. Other channels can exist and are well known to those skilled in the art. In general, the communications channel is assumed to introduce errors into the data transmitted between DCE's 12 and 14.

Salient features of the communications channel 16 can include the type of noise introduced by the environment, the impact of the communications channel on the signals transmitted between DCE's 12 and 14, and the statistics of the errors introduced. Typically the transmitted signals of a radio channel are attenuated in strength as a function of distance. The attenuation may be a simple function of range, perhaps with small random variations on the order of a few dB due to antenna pattern fluctuations or other factors. Alternatively, the variations may be large and rapid, as in a fading channel. Noise is typically additive, although other types of noise processes are known.

A common mathematical model for a channel is the so-called additive white Gaussian noise (AWGN) model. This model comprises additive noise with a flat frequency spectrum (hence it is "white") and a Gaussian amplitude distribution. If the information signal received by the DCE 14 is constant in amplitude, AWGN will tend to introduce errors that are uniformly scattered in time. If the information signal received by the DCE 14 varies in amplitude, AWGN will tend to introduce many errors when the signal is at low strength and fewer errors when the signal strength is high. The signal received on the $i^{th}$ receiving antenna 17 may be expressed as $$y_i(t)=a_i(t) \cdot x(t)+n_i(t) \quad (1)$$

where $y_i(t)$ is the received signal of the $i^{th}$ antenna, $x(t)$ is the transmitted signal as a function of time, $a_i(t)$ is the amplitude of the signal received with the $i^{th}$ receiving antenna (which may vary with time), and $n_i(t)$ is the noise received on the $i^{th}$ antenna (also varying with time). Note that $x(t)$ is the same for all received signals, but the amplitude and noise may vary.

Figure 2:
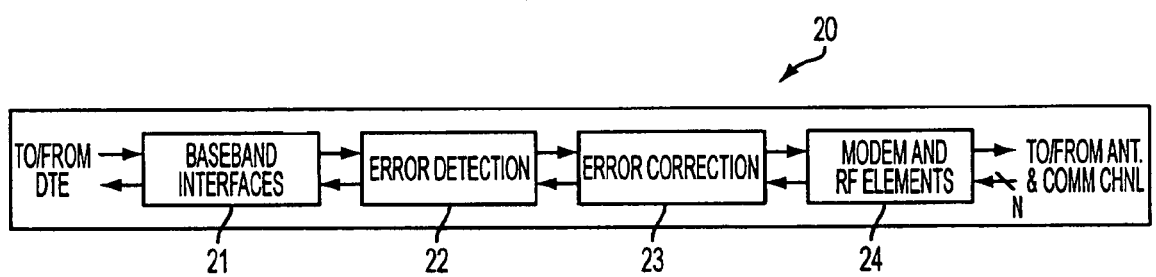
FIG. 2 illustrates the internal stages of a DCE.

FIG. 2 illustrates the salient functions of a DCE within a communications system 10 as illustrated in FIG. 1. The salient functions and stages of a DCE 20 comprise baseband interfaces 21, error detection 22, forward error correction 23 and modulation/demodulation equipment (modem) 24. For data transmission in a typical packet-oriented data communication system 10, the stages are processed in a left-to-right manner. The DCE 20 takes user data and reformats or groups a subset of the user data into a packet (part of baseband interfaces 21); applies error detection to the packet in 22; applies forward error correction in 23; and modulates the data packet for transmission over the communications channel in 24.

For data reception, the stages of FIG. 2 are processed in a right-to-left manner, i.e., stages 24–21. The DCE 20 receives and demodulates information from the communications channel in 24, decodes the forward error correcting code in 23, checks for remaining errors in 22, and if the data appears to be free of errors, delivers the user information to the user via baseband interfaces 21. The information passed from 24 to 23 can be any of several kinds of user information and of error correction information including hard decisions, soft decisions and erasures. Other information can also be passed (e.g., "meta-data" regarding channel characteristics).

In the case of a diversity channel as illustrated, either 24 or 23 (or both) could process the information associated with the N received signals $y_i(t)$ in order to generate a single best estimate $\hat{x}(t)$ of the transmitted information $x(t)$. For example, 24 could select one of the N received signals for delivery to 23, or it could form an optimum combination of the N inputs and deliver the combination to 23. Alternatively, 24 could deliver all N received signals to 23 for processing.

Figure 3:
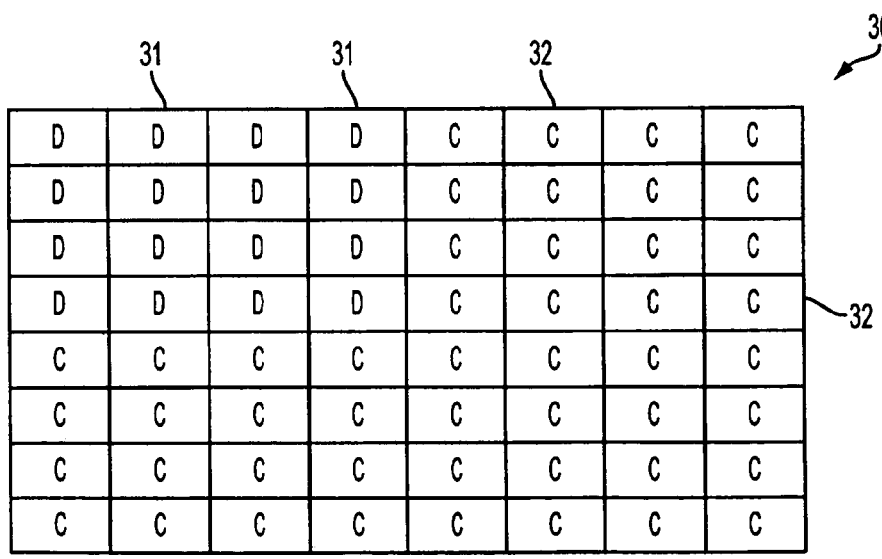
FIG. 3 illustrates the code structure of a two-dimensional turbo product code (TPC).
Figure 5:
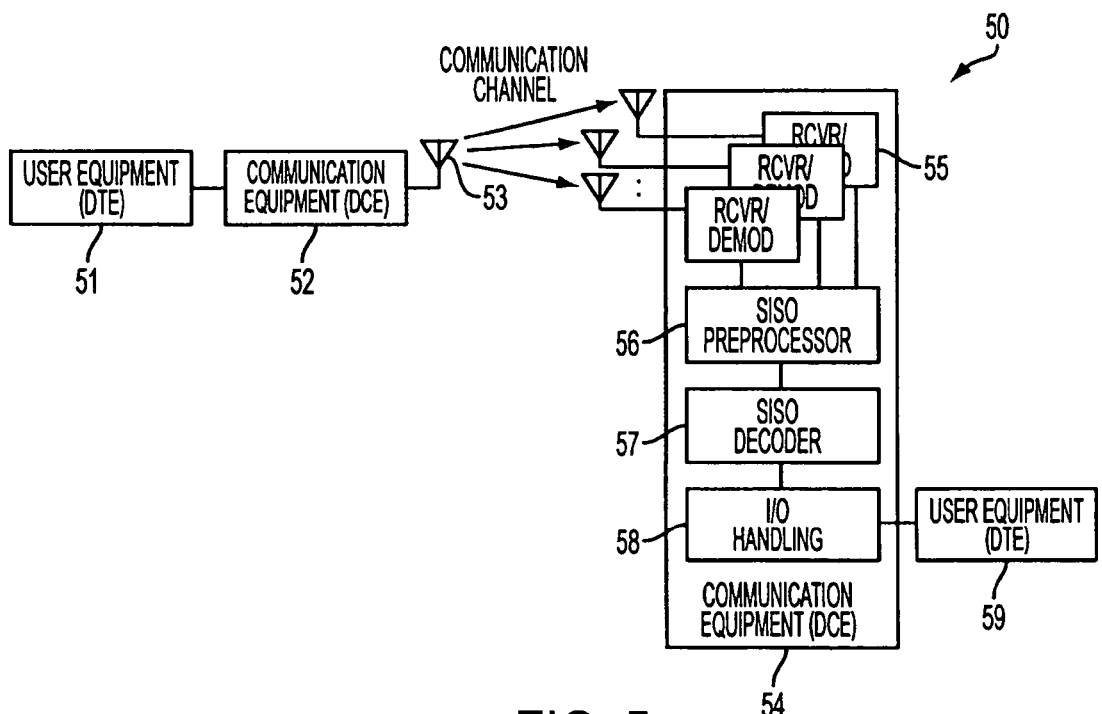
FIG. 5 illustrates another embodiment of a diversity communications system of the present invention.

FIG. 3 illustrates the basic structure of a two-dimensional (8,4)×(8,4) turbo product code (TPC) 30 comprised of (8,4) Hamming codes. Sixteen user information bits 31 (D) are encoded into a 64-bit block wherein each row and each column represents a codeword from the (8,4) Hamming code. D represents a user information bit 31 and C represents a parity check bit 32. Decoding can be performed iteratively on the received data using a SISO (soft-in soft-out) decoder as shown in FIG. 5. The decoder iterates the data until a stopping rule is satisfied (e.g., the decoder arrives at a self-consistent set of symbol decisions, or the iteration count exceeds a threshold).

Figure 4:
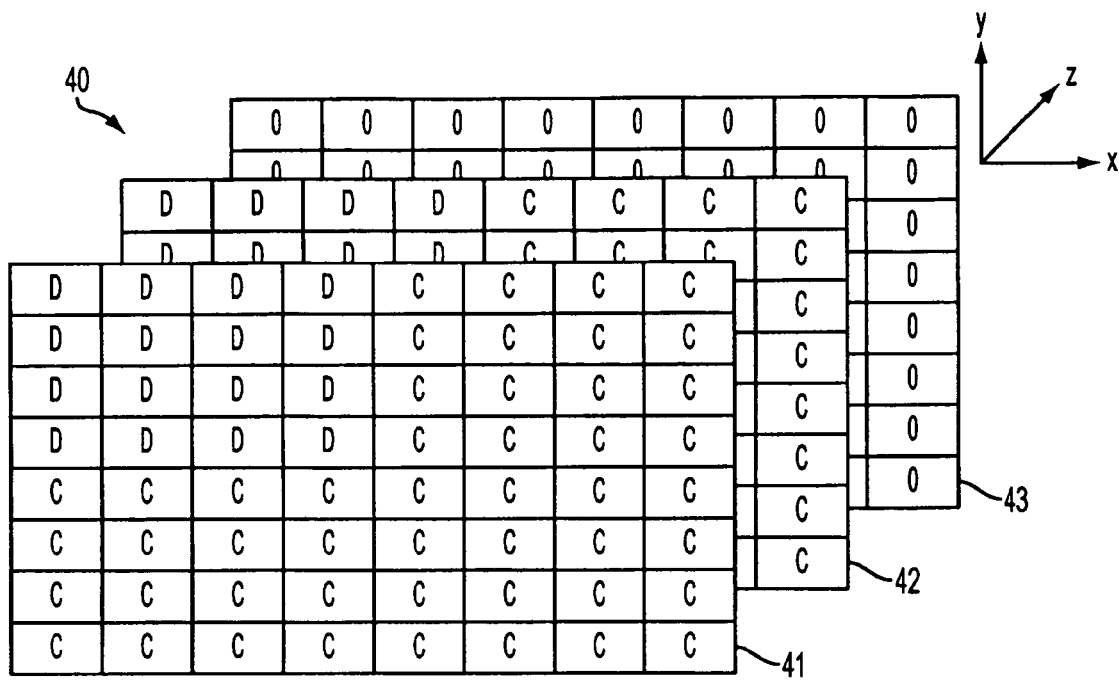
FIG. 4 illustrates the code structure of a three-dimensional TPC produced from a two-dimensional TPC according to the present invention.

FIG. 4 illustrates conceptually the data 40 presented to a SISO decoder from a diversity communications system in one embodiment of the present invention. It illustrates the case of a transmitter using an (8,4)×(8,4) turbo product code and a receiving system with dual receive diversity. The present system produces a three-dimensional data set 40, wherein the third dimension, denoted by "z" in the figure, represents an implicit code across the diversity paths. In this example, the implicit code is a simple dual repetition code with an additional parity check bit calculated as the XOR of the two copies of the transmitted bit (whether it is a data bit or a parity check bit). Data sets 41 and 42 represent the information received from the diversity paths (for example, two diversity receiving antennas).

Data set 43 represents the implicit parity check data that is not transmitted over the communications channel as it is known a priori that the two data sets 41 and 42 represent the same underlying transmitted data. In this illustrative example, the data set 43 is all zeros (0). All rows and columns of data set 43 are codewords of the (8,4) underlying code. Data set 43, received implicitly, has extremely high reliability since it is known a priori that the two data sets 41 and 42 represent the same underlying data, even if the received signals 41 and 42 indicate otherwise. The three-dimensional data set 40 represents a code block that can be decoded using a 3D TPC decoder.

The present system may also be applied to communications systems where the number of diversity channels is larger than 2. In this case, the form of the implicit code spanning the diversity channels (the "z" direction in FIG. 4) would be adjusted to accommodate the level of diversity employed. The number of planes in the 3D data set 40 is (N+1) where N is the number of diversity signal data sets. The values in the $(N+1)^{st}$ plane, representing the implicit parity information, can be adjusted to 0 or 1 depending on the number of diversity signals (even or odd), or the interpretation of the implicit parity bits can be altered. For example if an even number of data sets are received by an even number of receiving antennas, (N is even) all the bits in data set 43 are set to be zeros. If an odd number of data sets are received (N is odd), then all the bits in data set 43 are set to equal 1. The numerical value is not important so long as it is treated as indicating that all of the N data sets are bit-for-bit identical. Since the data set 43 does not need to be produced from any type of processing or operation, it does not consume any system resources.

FIG. 5 illustrates a communications system 50 of one preferred embodiment of the present invention. The data to be transmitted originates from the user data terminal equipment 51. This data is passed to the data communications equipment DCE 52. The transmitting DCE 52 forms a code block comprising a two-dimensional product code. The underlying codes can be any suitable codes and are not constrained to be (8,4) Hamming codes as described in FIG. 4. This code block is transmitted by antenna 53, and subsequently received by N≧2 receiving diversity-antennas. These antennas provide input (possibly through intermediate filters and systems) to the receivers and demodulators 55 contained in the DCE 54. The receivers/demodulators 55 each provide their copy of the received data to the SISO preprocessor 56. The SISO preprocessor 56 and associated memory means format the data and build a three-dimensional (3D) data set as shown in FIG. 4. This 3D data set includes the implicit parity check information and reliability information as previously described. The SISO decoder 57 iteratively processes the 3D data set to yield a single estimate of the transmitted data. A stopping rule and feedback loop needed to support iterative decoding can be integrated with the SISO decoder 57 itself. The final data is then provided to the I/O handling subsystem 58 that interfaces with the receiving DTE 59.

In addition to using the implicitly correct data set 43 in the decoding process, one benefit of the present invention is that the diversity processing is fully integrated with the SISO decoding in the DCE 54, thereby leading to improved overall performance. Another benefit is that the diversity combining is performed in the same device (and same software and firmware) as the TPC decoding, hence eliminating the cost and complexity of a separate diversity combining circuit and easing overall implementation. Still another benefit is that the characteristics of the separate diversity channels do not need to be explicitly estimated.

With sufficiently fast processors and suitable memory means, all functions performed by elements 56, 57 and 58 could be accommodated in a single general-purpose processor with associated memory and support circuits. In the event that a proper subset of the receivers/demodulators 55 are lost, or synchronization is not achieved leading to less than N sets of data available to the SISO preprocessor 56, the lost data sets can be treated as erasures and the SISO decoder 57 can still perform its function.

Another embodiment is a diversity communications system where the transmitter sends N copies of a code block (e.g., repetitions in time, frequency, or code) and the receiver receives N copies (for example, via a single antenna). Another embodiment is a diversity communications system where the transmitter sends N copies of a code block and the receiver receives >N copies (for example, due to receiver antenna diversity).

The present system can also be generalized to include higher numbers of dimensions. For example, if the transmitter forms a 3D product code (such that the encoded dimensionality, K, of the forward error correction code is K=3) that is received with multiple diversity copies, the SISO preprocessor 56 can form a 4D code block with associated reliability information for input to a suitable SISO decoder. The present system can also be particularized to transmit a code with a single dimension such as a simple Hamming code. In this case, the SISO preprocessor 56 forms a 2D code block equivalent to a 2D product code wherein one dimension is the underlying code (a Hamming code in this example) and the other dimension is a repetition code with appended parity check bits. In general, the transmitter 52 can form a product code of dimension (N), which when received with multiple diversity can be processed by the SISO preprocessor 56 to form a code block of dimension (N+1).

Figure 6:
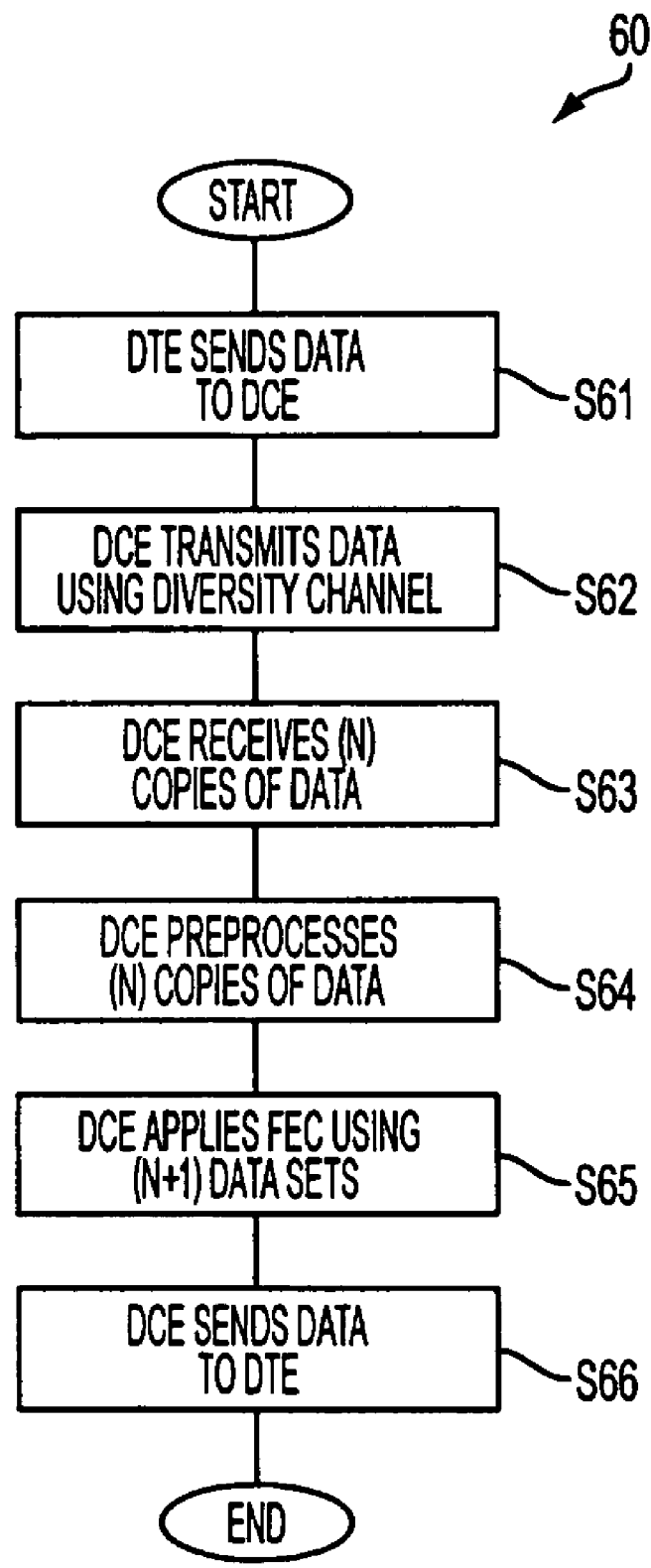
FIG. 6 shows a flow diagram of the steps enacted in the transmitting and receiving process of the present invention.

FIG. 6 is a flow diagram illustrating the steps in a transmitting and receiving process 60 of the present system. The process 60 begins in the DTE when data is sent from the DTE to the DCE in step S61. Once the DCE receives the data, it is processed by the stages as shown in FIG. 2 and transmitted in step S62. As described above, the data now contains forward error correction information, and is transmitted over a diversity channel. In step S63 the DCE receives (N) copies of the transmitted data. In step S64 the receiving DCE preprocesses each of the (N) copies of the data. In step S65 the preprocessed data is forward error corrected using the implicit data set which is assumed to be highly reliable, to yield the final decoded data that is passed to the user's DTE in step S66.

One skilled in the art will appreciate that although specific embodiments of the communications system have been described for purposes of illustration, various modifications can be made without deviating from the spirit and scope of the present invention. For example, the present invention may be applied to many different types of communications systems that employ different types of forward error correcting techniques. Accordingly, the invention is described by the appended claims.

I claim:

1. A system for receiving and decoding electronically transmitted data comprising:
    a plurality of receiving data demodulators for receiving (N) copies of transmitted data;
    a soft-in-soft-out (SISO) preprocessor that preprocess each of the (N) copies of the received data; and
    a soft-in-soft-out (SISO) decoder that processes (N+1) data sets; wherein the (N+1) data sets include the (N) copies of preprocessed data and one set of implicit data.

2. The system for receiving and decoding data as in claim 1 wherein the implicit data is not transmitted or received.

3. The system for receiving and decoding data as in claim 1 wherein each of the (N) copies of the received data has been turbo product encoded.

4. The system for receiving and decoding data as in claim 3 wherein the one set of implicit data contains parity bits.

5. The system for receiving and decoding data as in claim 4 wherein the one set of implicit data is given a high reliability rating in a turbo product decoding process.

6. A method for decoding information comprising the steps of:
    providing (N) copies of data; and
    applying turbo product decoding to (N+1) data sets, wherein the (N+1) data sets include the (N) copies of provided data and a set of implicit data.

7. The method for receiving and decoding transmitted information as in claim 6 wherein the set of implicit data is not transmitted or received.

8. The method for receiving and decoding transmitted information as in claim 7 wherein the one set of implicit data is parity data.

9. The method for receiving and decoding transmitted information as in claim 8 wherein each of the (N) copies of received data is turbo product encoded.

10. The method for receiving and decoding transmitted information as in claim 9 wherein the one set of implicit data is all zeros.

11. A system for transmitting and receiving data comprising:
    a transmitting data communications equipment including a forward error correction encoder, wherein the transmitting data communications equipment transmits data that contains an (K) dimensionally encoded forward error correction codes; and
    a receiving data communications equipment including a data demodulator, and a forward error correction decoder, wherein the receiving data communications equipment receives (N) copies of the (K) dimensionally encoded transmitted data and wherein the forward error correction decoder applies a (K+1) dimensional decoding process to the (N) copies of the (K) dimensionally encoded received data and a set of implicit data.

12. The system for transmitting and receiving data as in claim 11 wherein the set of implicit data is not transmitted or received.

13. The system for transmitting and receiving data as in claim 12 wherein the set of implicit data contains parity bits.

14. The system for transmitting and receiving data as in claim 11 wherein the forward error correction coder and forward error correction decoder apply turbo product codes.

15. The system for transmitting and receiving data as in claim 14 wherein the forward error correction decoder is a soft-in-soft-out (SISO) processor.

16. The system for transmitting and receiving data as in claim 15 wherein the SISO processor iteratively decodes the (N) copies of the (K) dimensionally encoded received data and one set of implicit data.

17. The system for transmitting and receiving data as in claim 16 wherein the set of implicit data is given a high reliability rating in the iterative decoding process.

18. The system for transmitting and receiving data as in claim 17 wherein the set of implicit data is all zeros (0).

19. The system for transmitting and receiving data as in claim 18 wherein the SISO processor iteratively decodes the (N) copies of the (K) dimensionally encoded received data and one set of implicit data until a rule is satisfied.

20. The system for transmitting and receiving data as in claim 19 wherein the rule is a predetermined number of iterations.

* * * * *

UNITED STATES PATENT AND TRADEMARK OFFICE
CERTIFICATE OF CORRECTION

PATENT NO. : 7,185,261 B2
APPLICATION NO. : 10/833888
DATED : February 27, 2007
INVENTOR(S) : Heppe It is certified that error appears in the above-identified patent and that said Letters Patent is hereby corrected as shown below:

In column 4, line 64, delete "diversity-antennas." and insert -- diversity antennas. --, therefor.

Signed and Sealed this

Eighth Day of July, 2008

JON W. DUDAS
*Director of the United States Patent and Trademark Office*